(12) United States Patent
Witty et al.

(10) Patent No.: US 6,519,162 B1
(45) Date of Patent: Feb. 11, 2003

(54) PROTECTIVE PANEL FOR A SPLITTER CHASSIS OR OTHER DEVICE FOR HOLDING ELECTRONIC CARDS

(75) Inventors: Amy J. Witty, Prior Lake, MN (US); David J. Anderson, Bloomington, MN (US); Matthias Van Doorn, Chanhassen, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/945,569

(22) Filed: Aug. 30, 2001

(51) Int. Cl.[7] .............................. H05K 7/14; H05K 5/02
(52) U.S. Cl. ...................... 361/796; 361/797; 361/730; 361/741; 361/756; 211/41.17
(58) Field of Search ................................ 361/796, 797, 361/730, 788, 802, 741, 756; 211/41.17

(56) References Cited

U.S. PATENT DOCUMENTS

| | | | | |
|---|---|---|---|---|
| 5,229,192 A | * | 7/1993 | Kober et al. | 428/209 |
| 5,498,471 A | * | 3/1996 | Hausdorf et al. | 428/283 |
| 5,559,678 A | * | 9/1996 | Fukuda et al. | 361/818 |
| 5,613,906 A | * | 3/1997 | Kikinis | 454/184 |
| 5,617,296 A | * | 4/1997 | Melville et al. | 361/736 |
| 5,642,264 A | * | 6/1997 | Cantrell | 361/802 |
| 5,783,777 A | | 7/1998 | Kruse et al. | 174/66 |
| 5,892,662 A | * | 4/1999 | Verma | 361/796 |
| 6,291,766 B1 | * | 9/2001 | Komai | 174/35 R |
| 6,327,155 B1 | * | 12/2001 | Niepmann et al. | 361/757 |

OTHER PUBLICATIONS

"BroadWire™ 120: High Density ADSL Splitter", *ADC Telecommunications, Inc.*, 8 pages (Sep. 2000).
"BroadWire™ 240: High Density ADSL Splitter", *ADC Telecommunications, Inc.*, 8 pages (Sep. 2000).
"BroadWire™ 528: High Density ADSL Splitter", *ADC Telecommunications, Inc.*, 8 pages (Sep. 2000).
"DSL POTS Splitter Shelf Family", *Corning Cable Systems LLC*, 8 pages (Sep. 2000).
"High Density xDSL Central Office Splitter: PS–1000 Series", *Wilcom*, 2 pages (Apr. 2000).
"Product Release: Wilcom Announces Highest Density CO ADSL POTS Splitter Series", *Wilcom*, 2 pages (Nov. 6, 2000).
"PS–1103 ADSL Central Office Line Filter Shelf: Quick Step Installation Instructions for PS–1103 Shelf", *Wilcom*, 2 pages (Jun. 2000).
"PS–1103 CO POTS Splitter: High Density xDSL Central Office Splitter", *Wilcom*, 2 pages (Jul. 2000).
"PS–1103 CO POTS Splitter: High Density xDSL Dentral Office Splitter", *Wilcom*, 2 pages (Nov. 2000).

* cited by examiner

*Primary Examiner*—David Martin
*Assistant Examiner*—Dameon E. Levi
(74) *Attorney, Agent, or Firm*—Merchant & Gould P.C.

(57) ABSTRACT

A protective panel for use in a splitter chassis is described in this disclosure. The protective panel is configured to at least partially cover a splitter card that would otherwise be exposed but for the presence of the panel.

17 Claims, 6 Drawing Sheets

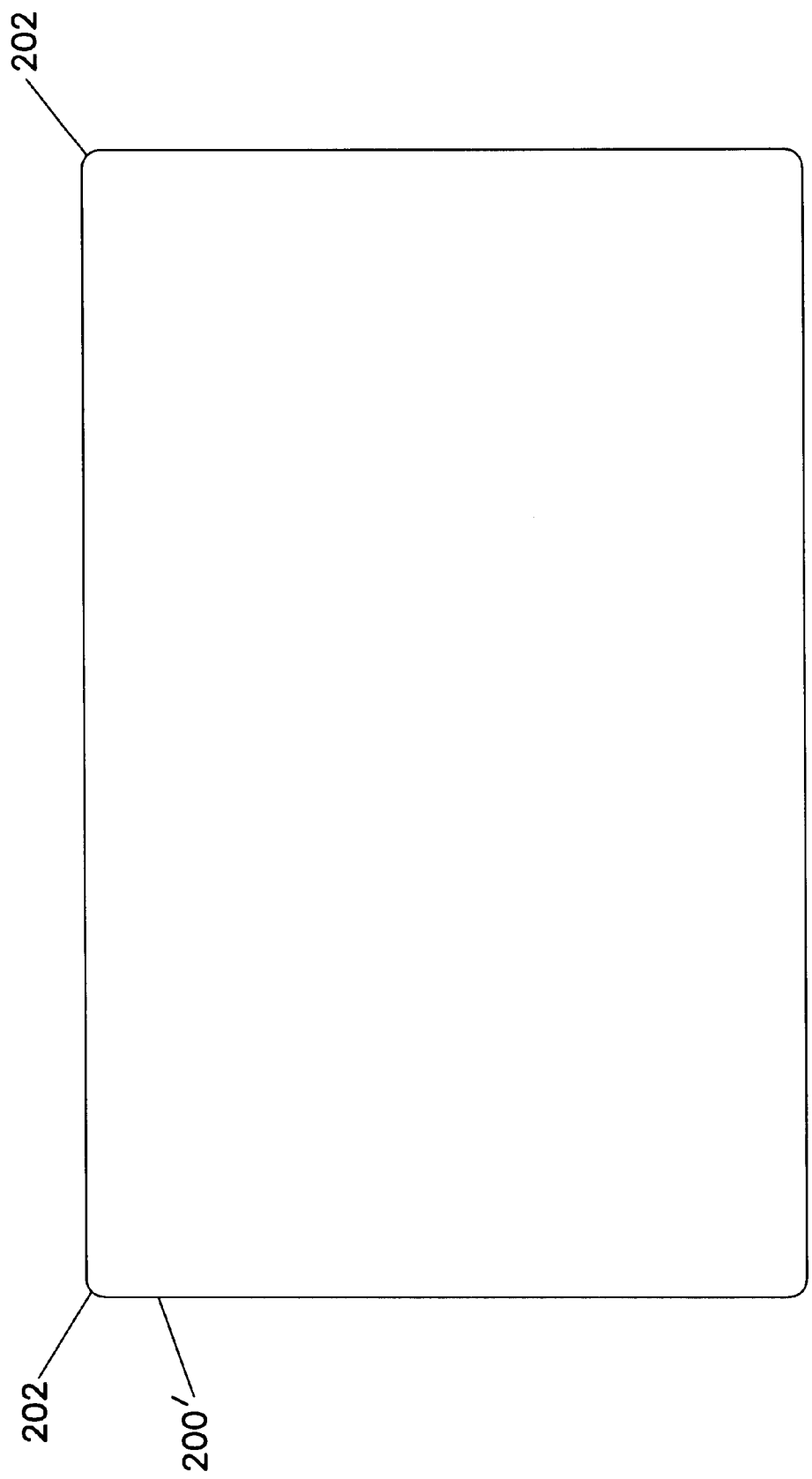

US 6,519,162 B1

PROTECTIVE PANEL FOR A SPLITTER CHASSIS OR OTHER DEVICE FOR HOLDING ELECTRONIC CARDS

FIELD OF THE INVENTION

The present invention relates generally to electronic equipment. More particularly, the present invention relates to equipment for use with a telecommunications device such as a splitter chassis.

BACKGROUND OF THE INVENTION

Telecommunications systems for transmitting voice and data to and from subscribers (i.e., residences and businesses) are known. An exemplary telecommunications system 10 is schematically shown in FIG. 1. The system 10 includes a Main Distribution Frame 12 (MDF) for connecting digital subscriber lines 13 (DSLs) to internal lines 14 within a telephone server's central office 15. The central office 15 frequently includes a DSLAM 18 (Digital Subscriber Line Access Multiplexer) and a voice switch 19. The DSLAM 18 transmits data to and receives data from a communications network/backbone 21. The voice switch 19 transmits voice signals to and receives voice signals from a communications network/backbone 23. The networks 21 and 23 can be dedicated lines that are part of the same network. POTS splitter devices 16 (i.e., Plain Old Telephone Service splitter devices) are used at the central office 15 to combine data signals from the DSLAM 18 with voice signals from the voice switch 19. By combining the signals, the signals can be simultaneously routed to a subscriber 25 through a single DSL 13. Signals transmitted from subscribers 25 to the central office 15 are also routed through the POTS splitter devices 16. At the POTS splitter devices 16, the signals are split and directed to the DSLAM 18 and the voice switch 19. Typically, the splitter devices 16 include low pass filters for removing the data content from any signals transmitted from the splitter devices 16 to the voice switch 19. Since DSLAMs 18 frequently include high pass filters for removing the voice band, the splitter devices 16 usually do not include filters for filtering the voice content from the signals transmitted to the DSLAM 18.

For most systems, it is desirable to maximize the splitter densities. To maximize splitter densities, multiple splitters are mounted on a printed circuit board to form a splitter card. To further maximize splitter densities, multiple splitter cards are mounted within the same chassis.

SUMMARY OF THE INVENTION

One aspect of the present invention relates to a protective panel mounted in a chassis for at least partially covering electronic components of a card within the chassis that would otherwise be exposed. Another aspect of the present invention relates to a method for using the protective panel.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

FIG. 6 is a plan view of another protective card that is an embodiment of the present invention.

Figure 1:
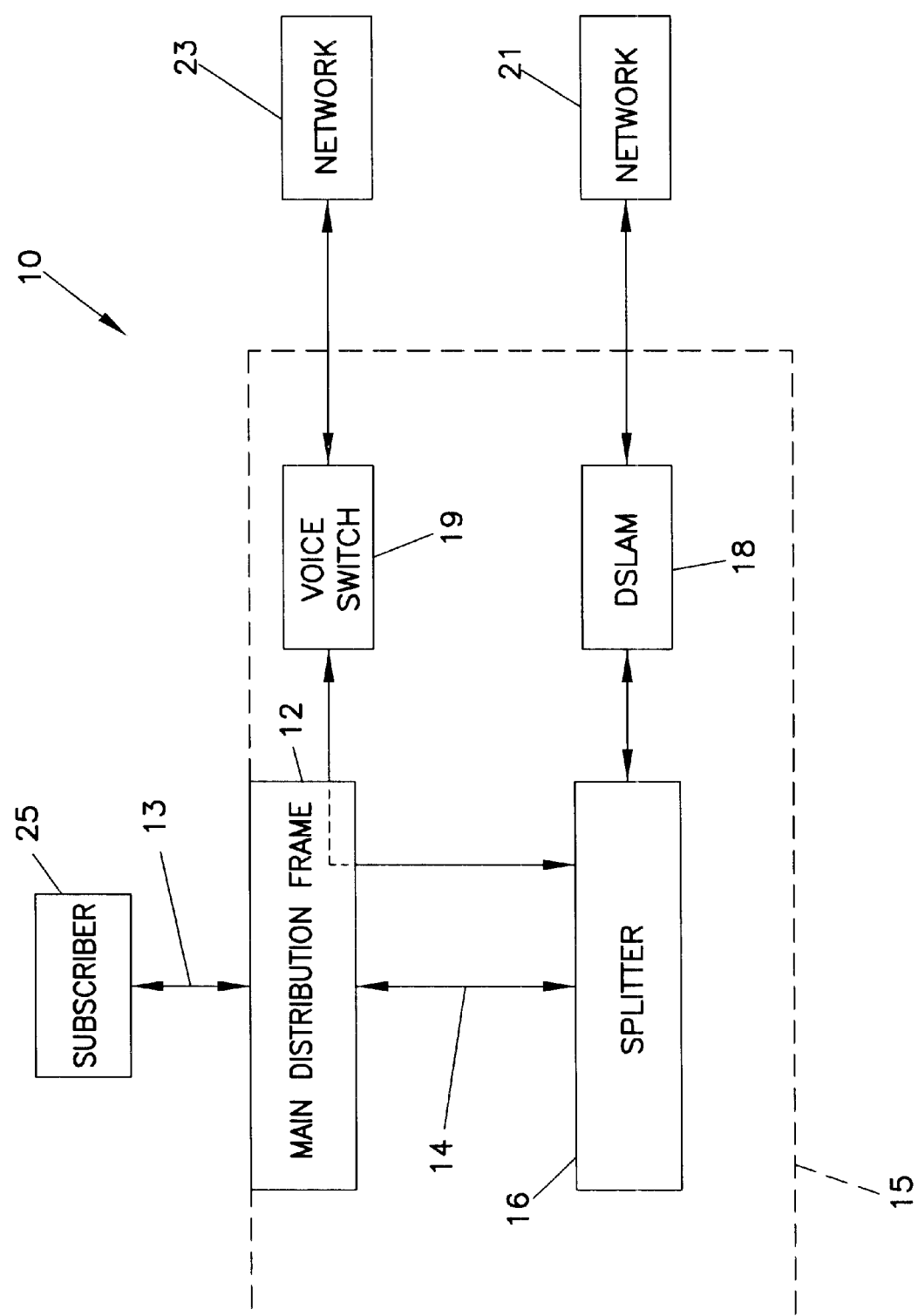
FIG. 1 is a diagram of a telecommunications system including an MDF, a splitter device, a DSLAM, and a voice switch.

While the invention is amenable to various modifications and alternative forms, specifics thereof have been shown by way of example in the drawings and will be described in detail below. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION

In the following detailed description, references are made to the accompanying drawings that depict various embodiments in which the invention may be practiced. It is to be understood that other embodiments may be utilized, and structural and functional changes may be made without departing from the scope of the present invention.

It will be appreciated that the various aspects of the present invention are applicable to a variety of telecommunications service options including, among other things, ADSL (Asymmetric Digital Subscriber Line), IDSL (Integrated Services Digital Network DSL), SDSL (Symmetric DSL) and VDSL (very high speed DSL) services.

I. Exemplary Splitter Assembly

Figure 2:
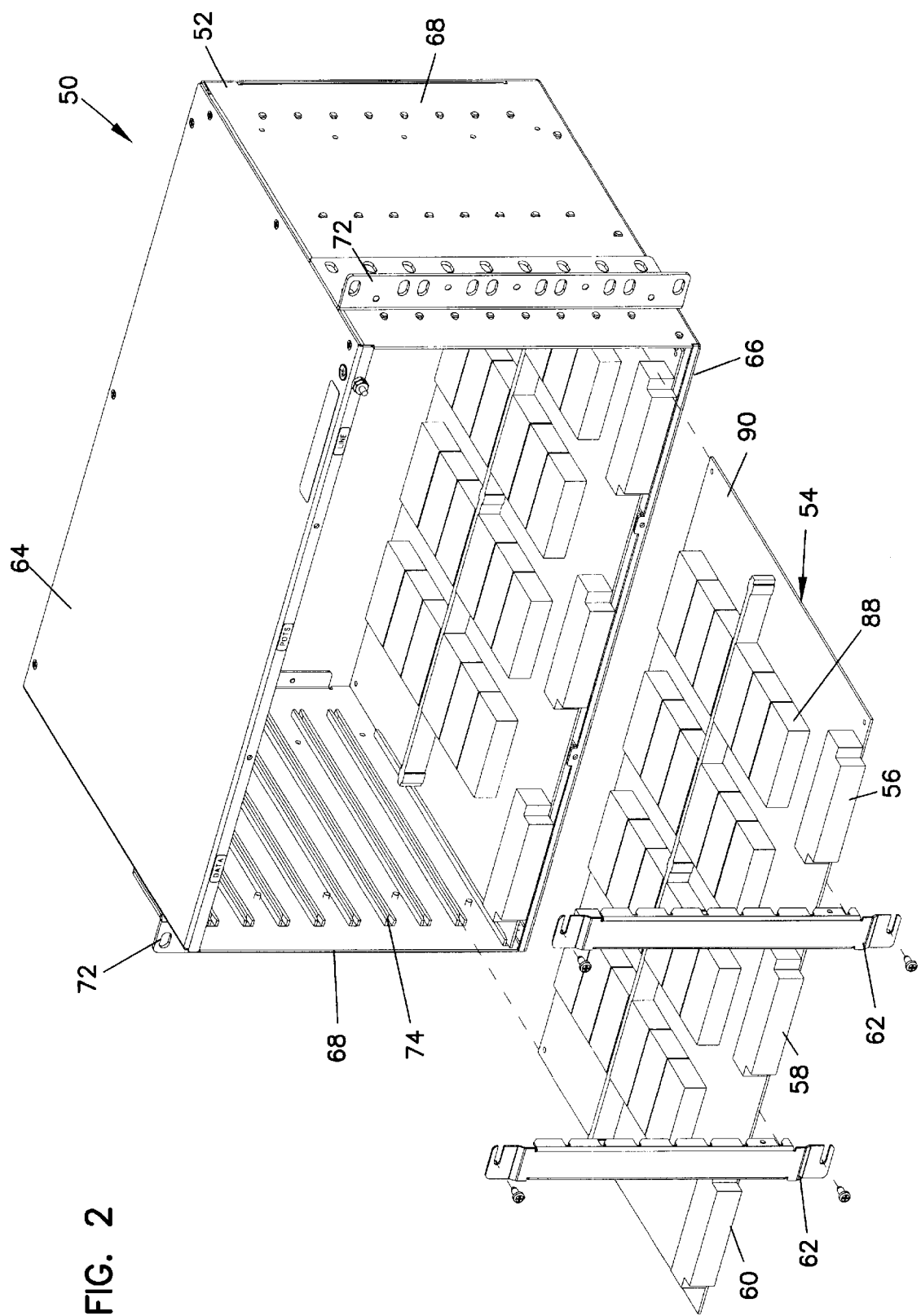
FIG. 2 is an exploded view of a POTS splitter assembly.

FIG. 2 illustrates a POTS splitter assembly 50 that is a non-limiting example of the type of assembly to which the principles of the present invention can be applied. The splitter assembly 50 includes a generally rectangular chassis 52 for mounting a plurality of POTS splitter cards 54 or other cards. The splitter cards 54 are shown horizontally mounted within the chassis 52. Each of the splitter cards 54 includes a LINE connector 56, a POTS connector 58 and a DATA connector 60. The LINE connectors 76 can be used to provide interface locations for allowing the splitter assembly 50 to interface with outside lines such as digital subscriber lines 13 (see FIG. 1). The POTS connectors 78 can be used to provide interface locations for allowing the splitter assembly 50 to interface with a voice switch such as voice switch 19 (see FIG. 1). The DATA connectors 80 can be used to provide interface locations for allowing the splitter assembly 50 to interface with a DSLAM such as DSLAM 18 (see FIG. 1). In a non-limiting embodiment, the connectors 76, 78 and 80 can be RJ-21 connectors for use in providing connections with corresponding connectors provided on cables such as 25-pair twisted pair cables. Retaining brackets 62 are mounted at the front of the chassis for retaining the splitter cards 54 within the chassis 52.

Figure 5:
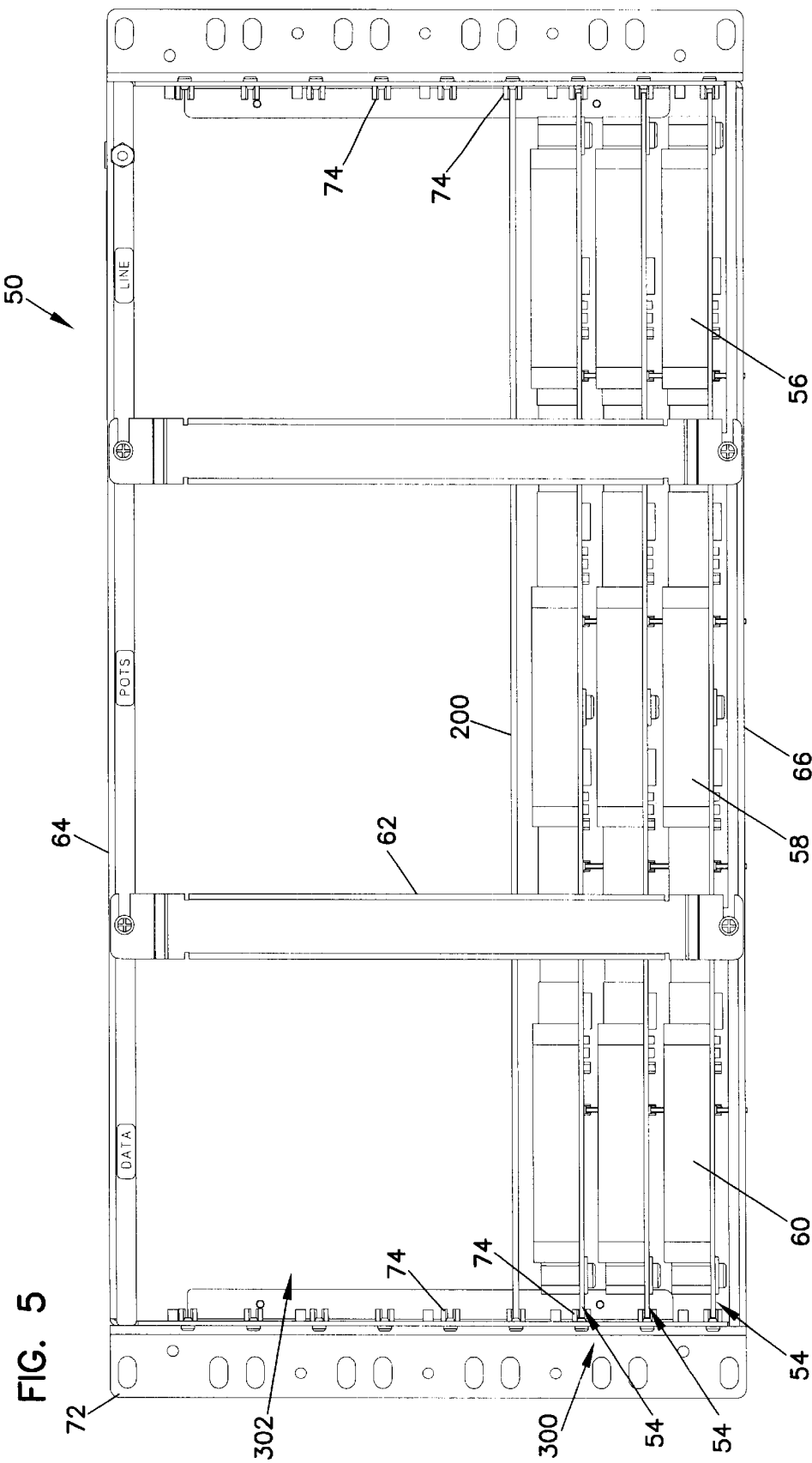
FIG. 5 is a front view showing the protective card of FIG. 4 mounted in the POTS splitter assembly of FIG. 2.

The chassis 52 is generally rectangular and includes opposing top and bottom walls 64 and 66 interconnected by opposing side walls 68. A back panel 70 preferably encloses the back of the chassis 52, while the front of the chassis 52 is preferably open so as to allow the splitter cards 54 to be inserted within the chassis 52. Side mounting flanges 72 are connected to the outer surfaces of the side walls 68. The side mounting flanges 72 allow the chassis 52 to be readily connected to a conventional telecommunications rack or frame. Horizontal tracks 74 are mounted on the inner surfaces of the side walls 68. The tracks 74 define channels for receiving left and right edges of the splitter cards 54. As best shown in FIG. 5, corresponding pairs of the tracks 74 oppose one another. The pairs of tracks 74 are vertically spaced-apart from one another so that the splitter cards 54 mounted within the tracks 74 are vertically spaced-apart and each held in a generally horizontal orientation.

The splitter cards 54 of the splitter assembly each include a plurality of POTS splitters 88 (e.g., 24 splitters) or other types of splitters (e.g., ISDN splitters) mounted on a circuit board 90. The circuit board 90 electrically connects the POTS splitters 88 to the connectors 56, 58 and 60.

The splitters 88 of the splitter assembly 50 can have a number of different configurations. For example, the splitters 88 can include conventional POTS splitter circuits. A conventional POTS splitter circuit functions to split a signal (e.g., a signal from a DSL) into two signals. One of the split signals is typically passed through one or more low pass filters capable of passing the relatively lower frequency voice content of the signal (e.g., less than about 4 kilohertz) and rejecting the signal content above the voice band (e.g., 30 kilohertz and above). This "voice-only" signal can then be transmitted from the splitter 88 to a voice switch such as voice switch 19. The other split signal can be transmitted from the splitter 88 to a DSLAM such as DSLAM 18. For such an embodiment, it is assumed that the DSLAM or other digital multiplexer that ultimately receives the composite signal will provide any required high-pass filter elements to remove the relatively low frequency voice signal content of the composite signal. In other embodiments, high pass filtration can be done at the splitters 88. It will further be appreciated that ISDN (Integrated Services Digital Network) filter circuits could also be used.

It will be appreciated that signals are transmitted bi-directionally through the splitters 88. Signals transmitted from DSLAMs and voice switches to the splitters 88 are combined at the splitters 88 such that the signals can be simultaneously routed to a subscriber 25 through a single DSL 13.

Figure 3:
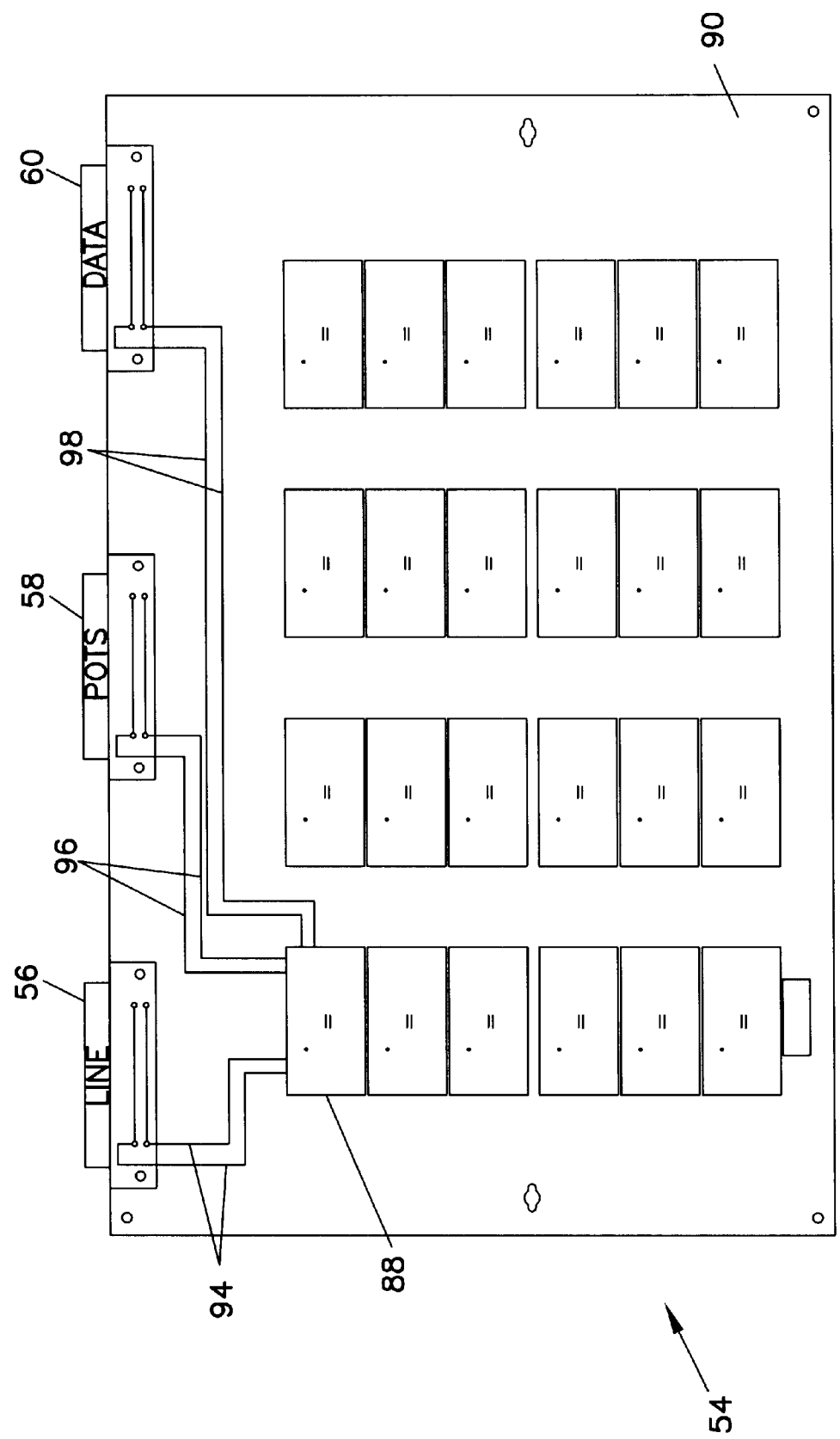
FIG. 3 is a schematic depiction of an exemplary splitter card suitable for use in the POTS splitter assembly of FIG. 2.

FIG. 3 is a schematic representation of one of the splitter cards 54. In FIG. 3, only one twisted pair circuit/channel is shown. It will be appreciated that similar circuits/channels are preferably provided for each of the remaining splitters. The circuit includes first tracings 94 electrically connecting the LINE connector 56 to a corresponding POTS splitter 88. The circuit also includes second tracings 96 electrically connecting the POTS splitter 88 to the POTS connector 58. The circuit further includes third tracings 98 that electrically connect the POTS splitter 88 to the DATA connector 60.

In use of the card 54, a LINE signal (e.g., a signal from a DSL) is inputted into the splitter card 54 through the LINE connector 56. From the LINE connector 56, the LINE signal is carried to a corresponding one of the POTS splitters 88 through tracings 94. At the POTS splitter 88, the LINE signal is split into a DATA signal (e.g., either a data only signal or a composite data signal) and a VOICE signal (a low frequency POTS signal). The DATA signal is conveyed from the POTS splitter 88 to the DATA connector 60 through tracings 98. From the DATA connector 60, the DATA signal can be output to a component such as a DSLAM (see DSLAM 18 of FIG. 1). The VOICE signal is conveyed from the POTS splitter 88 to the POTS connector 58 through tracings 96. From the POTS connector 58, the VOICE signal can be output to a component such as a voice switch (see voice switch 19 of FIG. 1). Signals traveling in the reverse direction through the splitter card 54 (i.e., signals input through the POTS and DATA connectors 58 and 60 from the voice switch and DSLAM) are combined at the splitters 54 and output to through the LINE connectors 56 (e.g., to a DSL).

II. Protective Card

In the telecommunications industry, it is common for a service provider to purchase a chassis that is only partially loaded with splitter cards. Typically, this is done to defer cost. As more capacity is needed, the service provider purchases additional splitter cards which are added to the chassis.

When the splitter chassis is only partially loaded, the circuitry of the uppermost splitter card is exposed (see FIG. 2). As so exposed, the circuitry can be contacted by a technician if the technician places his/her hand within the chassis. The present invention relates to a technique for reducing the exposure of a splitter card within a partially loaded chassis. The technique involves placing a protective card/panel adjacent to the exposed splitter card. Preferably, the protective card is placed sufficiently close the splitter card to prevent a technician's hand from being able to fit between the protective card and the splitter card.

The splitter chassis 52 of FIG. 2 is typically loaded from bottom to top. Thus, in this embodiment, the protective card is preferably mounted directly above the uppermost splitter card. As additional splitter cards are added to the chassis, the protective card can be moved to a higher position. Once the chassis is fully loaded, the protective card can be discarded or used on another chassis.

Figure 4:
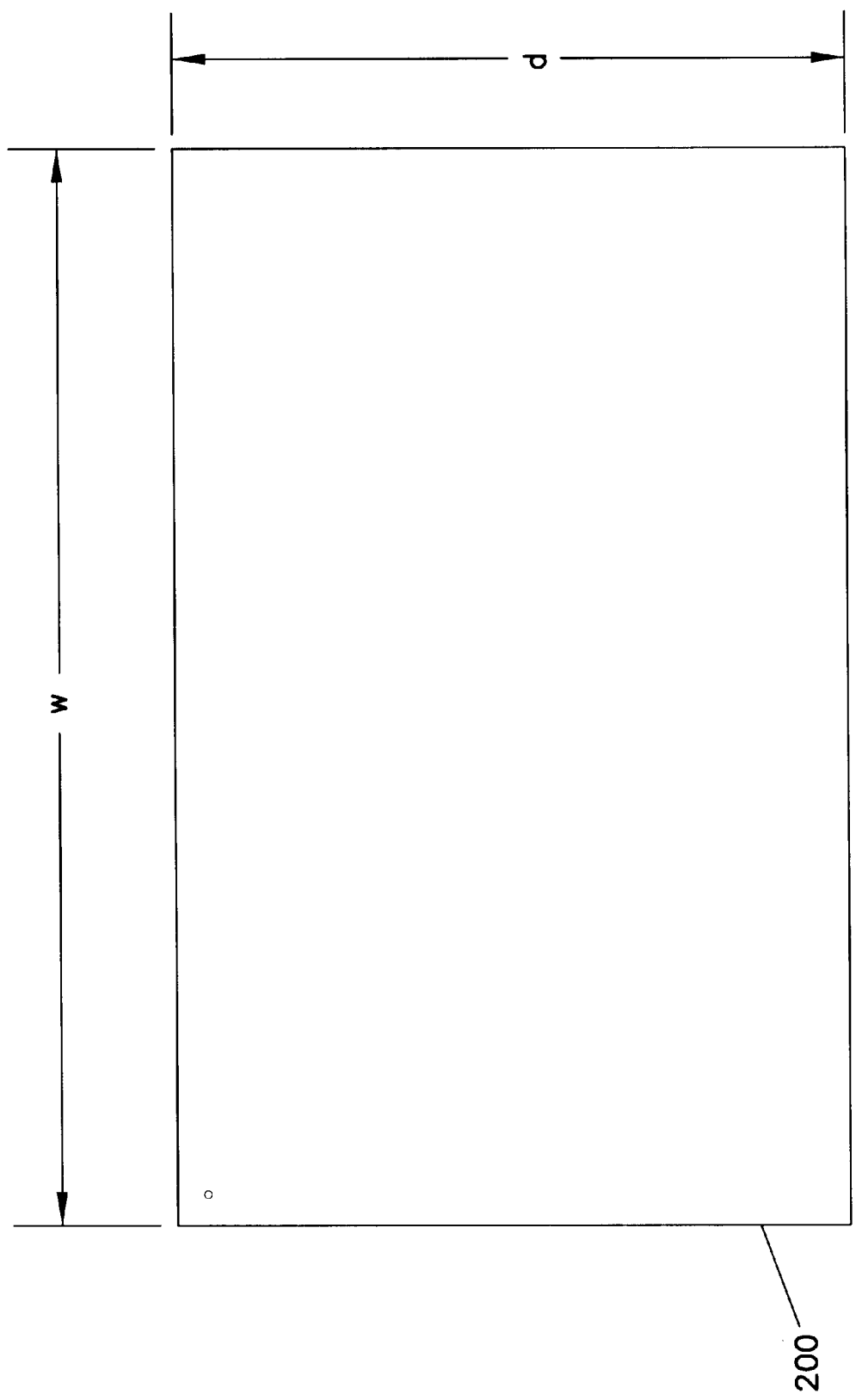
FIG. 4 is a plan view of a protective card that is an embodiment of the present invention.

FIG. 4 shows a protective card 200 constructed in accordance with the principles of the present invention. The protective card 200 is preferable devoid of any circuitry or splitters. In one non-limiting embodiment, the protective card 200 is made of a polymeric material (e.g., clear or tinted plastic). The material is preferably UL 94 V-0 rated for fire safety. Other materials such as coated sheet metal could also be used.

The protective card 200 is preferably sized to fit in the chassis 52. Preferably, left and right edges of the card 200 are configured to fit within opposing tracks 74 of the chassis 52. The protective card 200 is mounted in the chassis 52 by inserting the card 200 through the open front of the chassis 52 and into the tracks 74 corresponding to the desired position. To remove the card 200, the card is manually grasped and slid out the front of the chassis 52.

FIG. 5 shows the chassis 52 with three splitter cards mounted therein. The protective card 200 is mounted in the tracks 74 positioned immediately above the uppermost splitter card. As shown in FIG. 5, the protective card 200 separates a loaded region 300 of the chassis 52 from an open region 302 of the chassis 52.

In one non-limiting embodiment, the protective card has a thickness of about 0.06 inches, a width w of about 16.8 inches and a depth of about 10.6 inches. However, it will be appreciated that the size can be varied to correspond to the size of a given splitter chassis. Typical telecommunications racks for mounting splitter chassis typically have bay widths of 17.5 and 21.5 inches. Thus, in certain embodiments, a protective card in accordance with the principles of the present invention can have a width w in the range of 16–17.5 inches or in the range of 20–21.5 inches. In certain other embodiments, the depth d of the card can range from 3–15 inches, and the thickness can range from 0.030 to 0.120 inches. Of course, other sizes can also be used.

While the protective card 200 has been described as being mounted above an exposed splitter card, depending upon the configuration of the chassis, the protective panel could also be mounted below an exposed splitter card or along the side of an exposed splitter card. In any of the above-identified situations, the protective card is used to "cover" an exposed portion of a splitter card. To "cover" the splitter card, the protective card need not contact the exposed splitter card. The protective card is preferably placed close enough to the exposed splitter card to prevent a technician from placing his or her hand between the splitter card and the protective card.

Referring again to FIG. 4, instructions of use can be printed or otherwise displayed on the protective panel 200. For example, the instructions shown in FIG. 4 specify: "Load cards starting with the bottommost slot in the chassis. If all the chassis slots are not filled place this protective panel in the first slot above the top-most card." Of course, the instructions can be varied to correspond with the configuration of the chassis into which the protective panel is intended to be mounted.

FIG. 6 shows an alternative panel 200' having rounded corners 202. The rounded corners facilitate insertion of the card 200' into the tracks 74.

Protective cards in accordance with the principles of the present invention are preferably "blank" cards. It will be understood that the term "blank" cards means that the cards are free or devoid of operable circuitry.

With regard to the foregoing description, it is to be understood that changes may be made in detail without departing from the scope of the present invention. For example, while the invention has been shown in relation to a chassis for holding splitter cards, the invention is also useful with other types of telecommunications cards such as repeaters, amplifiers, signal generators, etc. Further, the invention is not limited to the telecommunications industry, but is applicable to any environment in which exposed electrical components are desired to be shielded. It is intended that the specification and depicted aspects of the invention may be considered exemplary, only, with a true scope and spirit of the invention being indicated by the broad meaning of the following claims.

What is claimed is:

1. A telecommunications assembly comprising:
   a chassis partially loaded with one or more splitter cards, the one or more splitter cards including an exposed splitter card;
   a blank protective panel removably mounted within the chassis adjacent to the exposed splitter card such that the exposed splitter card is at least partially covered; and
   method of use instructions printed on the protective panel.

2. The telecommunications assembly of claim 1, wherein the blank protective panel is positioned above the exposed splitter card.

3. The telecommunications assembly of claim 1, wherein the chassis includes opposing guide tracks, and wherein the one or more splitter cards and the protective panel are slidably mounted in the tracks.

4. The telecommunications assembly of claim 1, wherein the protective panel is made of a plastic material.

5. The telecommunications assembly of claim 1, wherein the protective panel is fire resistant.

6. A telecommunications assembly comprising:
   a chassis partially loaded with one or more splitter cards, the one or more splitter cards including an exposed splitter card;
   a blank protective panel removably mounted within the chassis adjacent to the exposed splitter card such that the exposed splitter card is at least partially covered; and
   the protective panel having rounded corners.

7. A telecommunications assembly comprising:
   a chassis including a loaded region with one or more electronic cards, multiple sets of opposing tracks, and an open region;
   a blank protective panel removably mounted within the chassis, the protective panel being positioned by itself within its own set of opposing tracks such that the protective panel separates the loaded region of the chassis from an open region of the chassis; and
   method of use instructions printed on the protective panel.

8. The telecommunications assembly of claim 7, wherein the blank protective panel is positioned above the loaded region.

9. The telecommunications assembly of claim 7, wherein the chassis includes opposing guide tracks, and wherein the one or more splitter cards and the protective panel are slidably mounted in the tracks.

10. The telecommunications assembly of claim 7, wherein the protective panel is made of a plastic material.

11. The telecommunications assembly of claim 7, wherein the protective panel is fire resistant.

12. A telecommunications assembly comprising:
   a chassis including a loaded region with one or more electronic cards, multiple sets of opposing tracks, and an open region;
   a blank protective panel removably mounted within the chassis, the protective panel being positioned by itself within its own set of opposing tracks such that the protective panel separates the loaded region of the chassis from an open region of the chassis; and
   the protective panel having rounded corners.

13. An assembly comprising:
   a chassis partially loaded with one or more electronic cards, the one or more electronic cards including an exposed card;
   a blank protective panel removably mounted within the chassis, the blank protective panel being positioned by itself within its own set of opposing tracks adjacent the exposed card such that the exposed card is at least partially covered; and
   wherein the exposed electronic card is a telecommunications card.

14. The assembly of claim 13, wherein the chassis includes opposing guide tracks, and wherein the one or more electronic cards and the protective panel are slidably mounted in the tracks.

15. The telecommunications assembly of claim 13, wherein the protective panel is made of a plastic material.

16. A telecommunications assembly comprising:
   a chassis including a loaded region with one or more electronic cards and an open region; and
   a blank protective panel removably mounted within the chassis, the protective panel being positioned such that the protective panel separates the loaded region of the chassis from an open region of the chassis; and
   the protective panel having printed on it method of use instructions.

17. A telecommunications assembly comprising:

a chassis including a loaded region with one or more electronic cards and an open region; and a blank protective panel removably mounted within the chassis, the protective panel being positioned such that the protective panel separates the loaded region of the chassis from an open region of the chassis; and the protective panel having rounded corners.

* * * * *